(12) United States Patent
Amano et al.

(10) Patent No.: US 8,916,466 B2
(45) Date of Patent: Dec. 23, 2014

(54) METHOD FOR MANUFACTURING DUAL DAMASCENE WIRING IN SEMICONDUCTOR DEVICE

(75) Inventors: Mari Amano, Tokyo (JP); Munehiro Tada, Tokyo (JP); Naoya Furutake, Tokyo (JP); Yoshihiro Hayashi, Tokyo (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 573 days.

(21) Appl. No.: 13/067,960

(22) Filed: Jul. 11, 2011

(65) Prior Publication Data

US 2011/0266678 A1 Nov. 3, 2011

Related U.S. Application Data

(62) Division of application No. 11/659,800, filed as application No. PCT/JP2005/014855 on Aug. 12, 2005, now Pat. No. 8,004,087.

(30) Foreign Application Priority Data

Aug. 12, 2004 (JP) .................................. 2004-235133

(51) Int. Cl.
*H01L 23/485* (2006.01)
*H01L 21/768* (2006.01)
*H01L 23/532* (2006.01)

(52) U.S. Cl.
CPC .. *H01L 21/76877* (2013.01); *H01L 23/532333* (2013.01); *H01L 23/53295* (2013.01); *H01L 23/5329* (2013.01)
USPC ...................... 438/629; 257/762; 257/E23.01

(58) Field of Classification Search
USPC .............................. 438/629; 257/762, E23.01
See application file for complete search history.

(56) References Cited

U.S. PATENT DOCUMENTS 6,630,741 B1   10/2003   Lopatin et al.
6,979,625 B1   12/2005   Woo et al.
(Continued)

FOREIGN PATENT DOCUMENTS

JP    9-289214      11/1997
JP    2000-150522 A  5/2000
(Continued)

OTHER PUBLICATIONS

International Search Report dated Oct. 25, 2005.
(Continued)

*Primary Examiner* — Michael Jung
*Assistant Examiner* — John P Dulka
(74) *Attorney, Agent, or Firm* — McGinn IP Law Group, PLLC

(57) ABSTRACT

A semiconductor device includes a semiconductor substrate, an insulating film formed above the semiconductor substrate, and a multilayered wiring formed in a prescribed area within the insulating film. The multilayered wiring includes a dual damascene wiring positioned on at least one layer of the multilayered wiring. The dual damascene wiring includes an alloy having copper as a principal component. A concentration of at least one metallic element contained as an added component of the alloy in a via connected to the dual damascene wiring is 10% or more higher in a via connected to a wiring whose width exceeds by five or more times a diameter of the via than that in another via connected to another wiring of a smallest width in a same upper wiring layer of the multilayered wiring.

15 Claims, 5 Drawing Sheets

(56) References Cited

U.S. PATENT DOCUMENTS

| | | | |
|---|---|---|---|
| 2001/0039111 A1* | 11/2001 | Morozumi | 438/618 |
| 2002/0024142 A1 | 2/2002 | Sekiguchi | |
| 2004/0000719 A1* | 1/2004 | Matsubara et al. | 257/767 |
| 2004/0014312 A1* | 1/2004 | Kunishima et al. | 438/637 |
| 2004/0188850 A1 | 9/2004 | Lee et al. | |
| 2005/0151266 A1 | 7/2005 | Yoshizawa et al. | |
| 2005/0272258 A1 | 12/2005 | Morita et al. | |
| 2006/0091551 A1 | 5/2006 | Lin et al. | |
| 2009/0203208 A1 | 8/2009 | Ueki et al. | |

FOREIGN PATENT DOCUMENTS

| | | |
|---|---|---|
| JP | 2002-33384 | 1/2002 |
| JP | 2003-257970 | 9/2003 |
| JP | 2003-273209 | 9/2003 |
| JP | 2004-31847 | 1/2004 |
| JP | 2004-40022 | 2/2004 |
| JP | 2004-40101 | 2/2004 |
| JP | 2004-235620 | 8/2004 |
| JP | 2004-289008 | 10/2004 |
| JP | 2005-38999 | 2/2005 |

OTHER PUBLICATIONS

Kawano, M., et al., "Stress Relaxation in Dual-damascene Cu Interconnects to Suppress Stress-induced Voiding", Proceedings of the IEEE 2003 International Interconnect Technology Conference, 2003, pp. 210-212.

Oshima, T., et al., "Improvement of Thermal Stability of Via Resistance in Dual Damascene Copper Interconnection", IEEE International Electron Device Meeting, 2000, pp. 6.2.1-6.2.4.

Suzuki, T., et al., "Stress induced failure analyais by stress measurements in Copper dual damascene interconnects", Proceedings of the IEEE 2002 International Interconnect Technology Conference, 2002, pp. 229-230.

* cited by examiner

Related Art

METHOD FOR MANUFACTURING DUAL DAMASCENE WIRING IN SEMICONDUCTOR DEVICE

The present application is a Divisional Application of U.S. patent application Ser. No. 11/659,800, filed on Feb. 9, 2007, now U.S. Pat. No. 8,004,087 which is based on and claims priority from international patent application No. PCT/JP2005/014855, filed on Aug. 12, 2005, which is based on and claims priority from Japanese patent application No. 2004-235133, filed on Aug. 12, 2004, the entire contents of which are incorporated herein by reference.

TECHNICAL FIELD

The present invention relates to a wired semiconductor device; and more particularly to a semiconductor device having a trenched (damascene) wiring structure with copper as a principal component, and a method for manufacturing same.

BACKGROUND ART

In silicon semiconductor integrated circuits, local wiring positioned on a lower layer of multilayered wiring has the smallest dimensions in terms of wiring width and via diameter, and is a component in which serious problems related to reliability occur. Local wiring used for supplying power or other purposes is wider than other wiring in the same layer, leading to a major difference in size relative to the vias used to connect the wires. The formation of voids caused by stress in such areas is a particularly serious problem. Such voids are called stress-induced voids.

The interior of vias in dual damascene wiring is one place where stress-induced voids occur. Stress-induced voids that form in the vias are regarded to be due to the difference in stress in the vias and the wiring. A model is used to describe the phenomenon (non-patent document 1, p. 125, FIG. 8(a)), whereby heat during a process causes copper to expand, the compressive stress in the vias increases in the process, and the copper is accordingly squeezed out onto the wiring. However, when the temperature drops and the volume decreases, the amount of copper in the via will be inadequate, and voids will form. Wiring patterns involving small via diameters and major differences between the wiring width and via diameter are regarded to be patterns in which stress-induced voids readily occur. Results reported from the use of such patterns have indicated that failures readily tend to occur, and the difference in stress inside the vias and the wiring is large (non-patent document 2, p. 229, FIG. 2, p. 230, FIG. 4).

In order to solve such problems, a method has been proposed for eliminating locations where major variations in local stress occur, such as where very small vias are connected to wide wiring. For example, in an embodiment described in patent document 1, an island 17 of an insulating film is provided within the wiring and kept in contact with a location connected to a via 16, as shown in the plane view of the wiring in FIG. 5. As a result, an island of insulating film is provided in close proximity to a via within wide wiring, and the width of the wiring connected to the via is reduced. This method accordingly overcomes the degrading phenomenon that is characteristic of wide wiring.

Another method has been proposed as a solution, whereby the copper of the wiring material is alloyed to improve the migration resistance of the copper as such. In patent document 2, silver or another material is added to the copper to form a copper alloy. Examples of methods for forming a copper alloy film in which such materials have been added include a method in which sputtering is performed using a target in which such additives are added and an alloy is formed, a method whereby a plating is formed using copper and tin or chromium to form an alloy of these metals, and a method involving the use of CVD (chemical vapor deposition) to form a film.

Patent document 1, Japanese Laid-Open Patent Application No. 2002-33384
Patent document 2, Japanese Laid-Open Patent Application No. 9-289214
Non-patent document 1, T. Oshima, et al., IEEE International Electron Device Meeting, 2000, pp. 123 to 126
Non-patent document 2, T. Suzuki, et al., Proceedings of the IEEE 2002 International Interconnect Technology Conference, pp. 229 to 230
Non-patent document 3, M. Kawano, et al., Proceedings of the IEEE 2003 International Interconnect Technology Conference, pp. 210 to 211

DISCLOSURE OF THE INVENTION

Problem to be Solved by the Invention

However, in addition to minimizing stress-induced voids, the technique indicated in patent document 1 for modifying the wiring pattern create problems such as requiring the layout of the wiring pattern to be re-examined, and a new reticle to be fabricated for forming the pattern. Also, problems have arisen with the hitherto disclosed methods whereby other chemical elements are added to copper, such as in patent document 2. Specifically, impurities that are added to ensure a prescribed degree of reliability in wide wired regions, in the via parts connected thereto, and in other areas where reliability is a particular problem are similarly added in wired regions and via parts where reliability-related problems are not presented. As a result, the resistivity of the copper alloy rises, and the ability of the circuit to operate at high speeds is compromised.

Therefore, an object of the present invention is to provide a semiconductor device and a method for manufacturing the device having a trenched (damascene) wiring structure that comprises an alloy in which copper is a principal component, wherein increases in the resistance of the wiring and occurrences of stress-induced voids are minimized, and reliability is improved.

Means Used to Solve the Above-Mentioned Problems

A semiconductor device according to a first aspect of the present invention comprises a semiconductor substrate, an insulating film formed above the semiconductor substrate, and multilayered wiring formed in a prescribed area within the insulating film, wherein the multilayered wiring has dual damascene wiring positioned on at least one layer thereof, the dual damascene wiring is composed of an alloy having copper as a principal component, a concentration of at least one metallic element contained as an added component of the alloy in a via connected to the dual damascene wiring is determined according to a width of the wiring on an upper layer where the via is connected, and the concentration of at least one metallic element within the via connected to the upper layer wiring increases with the width of the wiring of the upper layer.

A semiconductor device according to a second aspect of the present invention comprises a semiconductor substrate, an insulating film formed above the semiconductor substrate, and multilayered wiring formed in a prescribed area within the insulating film, wherein the multilayered wiring has dual damascene wiring positioned on at least one layer thereof, the dual damascene wiring is composed of an alloy having copper as a principal component, the concentration of at least one metallic element contained as an added component of the alloy in a via connected to the dual damascene wiring is 10% or more higher in a via connected to wiring whose width exceeds by five or more times a diameter of the via than in a via connected to a wiring of the smallest width in the same wiring layer.

In these semiconductor devices, the metallic element is, for example, at least one element selected from the group consisting of titanium, tungsten, aluminum, tin, silver, zirconium, indium, silicon, and magnesium.

Also, the concentration of the metallic element in a via connected to the dual damascene wiring is, for example, equal to or less than the solid solubility limit of the metallic element with regard to copper.

The concentration of the metallic element in a via connected to the dual damascene wiring is preferably 1 at % or less.

A method for manufacturing the semiconductor device according to a third aspect of the present invention comprises the steps of:

(a) forming grooves and vias in order to form dual damascene wiring in a prescribed area within an insulating film formed above a semiconductor substrate;

(b) forming a diffusion prevention layer on a surface of the grooves and vias;

(c) forming a lower-layer copper or copper alloy film on the diffusion prevention film to a thickness that is less than a thickness at which all the grooves and vias are covered;

(d) forming an upper layer copper alloy film comprising a copper alloy containing an added metallic element in a concentration that is higher than in the lower-layer copper or copper alloy film, the thickness of the upper layer copper alloy film being sufficient so that all the grooves and vias are covered on the lower-layer copper or copper alloy film; and (e) performing heating to diffuse the added metallic element contained in the upper layer copper alloy film formed in step (d) throughout the lower-layer copper or copper alloy film formed in step (c).

A method for manufacturing the semiconductor device according to a fourth aspect of the present invention comprises the steps of:

(a) forming grooves and vias in order to form dual damascene wiring in a prescribed area within an insulating film formed above a semiconductor substrate;

(b) forming a diffusion prevention layer on a surface of the grooves and vias;

(c) sputtering a lower-layer copper alloy seed film on the diffusion prevention film to a thickness that is less than a thickness at which all the grooves and vias are covered;

(d) forming on the lower-layer copper alloy seed film an upper layer copper or copper alloy film comprising copper or a copper alloy containing an added metallic element in a concentration that is lower than in the lower-layer copper alloy seed film, the thickness of the upper layer copper alloy film being sufficient so that all the grooves and vias are covered; and (e) performing heating to diffuse the added metallic element contained in the lower-layer copper alloy seed film formed in step (c) throughout the upper layer copper or copper alloy film formed in step (d).

A method for manufacturing the semiconductor device according to a fifth aspect of the present invention comprises the steps of:

(a) forming grooves and vias in order to form dual damascene wiring in a prescribed area within an insulating film formed above a semiconductor substrate;

(b) forming a diffusion prevention layer on a surface of the grooves and vias;

(c) forming a lower-layer copper or copper alloy film on the diffusion prevention film to a thickness that is less than a thickness allowing for complete covering of all vias connected to wiring that is five or more times as wide as the via diameter, and of all grooves for forming the vias; and is equal to or greater than a thickness allowing for complete covering of all vias connected to wiring that is less than five times as wide as the via diameter, and of all grooves for forming the vias;

(d) forming on the copper or copper alloy film another copper alloy film comprising a copper alloy that contains an added metallic element in a concentration that is higher than in the copper or copper alloy film, the other copper alloy film being formed to a thickness at which all the grooves and vias are covered; and (e) performing heating whereby the added metallic element contained in the other copper alloy film formed in step (d) is diffused throughout the copper or copper alloy film formed in step (c).

Effect of the Invention

According to the present invention, the migration of copper is suppressed and reliability is accordingly improved by increasing the concentration of the metallic element added to the copper in the copper alloy used to form via parts that connect to wide wiring, in which stress-induced voids have been a problem. Simultaneously, the high speed of the circuit does not have to be compromised more than necessary because the concentration of the added metallic element is kept low in the via parts that connect to narrow wiring, thereby suppressing increases in the electrical resistance.

Also, in the method for manufacturing the semiconductor manufactured device according to the present invention, a semiconductor device that combines the above-mentioned circuit reliability with high speed circuit performance can be readily manufactured without using complicated steps.

KEY

Figure 1:
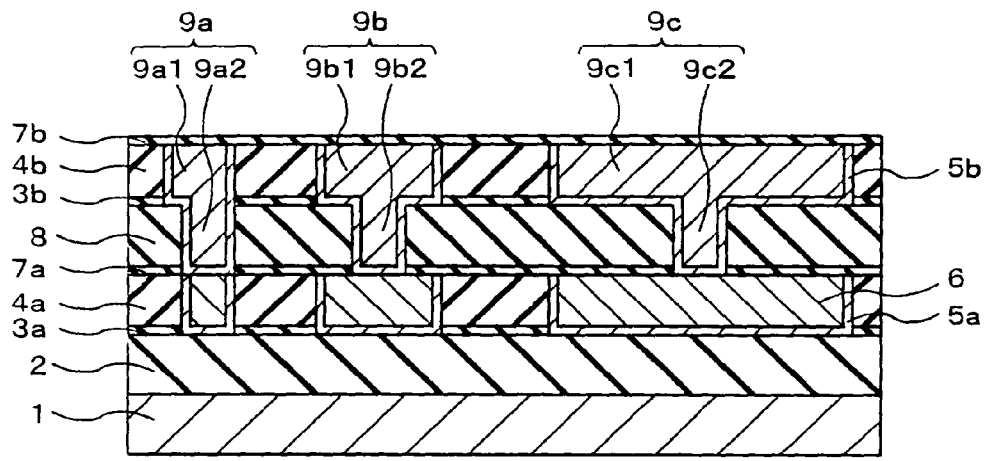
FIG. 1 is a cross-sectional view of the semiconductor device according to an embodiment of the present invention.

1 SEMICONDUCTOR SUBSTRATE
2 INTER-LAYER INSULATING FILM 3a, 3b ETCH STOP FILM
4a, 4b INTER-LAYER INSULATING FILM
5a, 5b BARRIER METAL FILM
6 WIRING
7a, 7b WIRING OVERCOAT
8 INTER-VIA LAYER INSULATING FILM
9a, 9b, 9c DUAL DAMASCENE WIRING
9a1, 9b1, 9c WIRING
9a2, 9b2, 9c2 VIA PART
10 COPPER FILM
11 COPPER ALLOY FILM
12 COPPER ALLOY SEED FILM

BEST MODE FOR CARRYING OUT THE INVENTION

First, the definitions of the terminology in the present application will be discussed before describing in detail the embodiments of the semiconductor device according to the present invention.

The concentration of the metallic element in the via in the present application refers to the average concentration in the via interior of the added metallic element contained in the copper. The copper used in the wiring has a typical polycrystal structure, and comprises crystal grains of copper and the grain boundaries thereof. Therefore, the metallic element added as an impurity may readily undergo segregation at the grain boundaries, and the concentration may be higher at the grain boundaries than within the grains. A metallic element that has been segregated at the grain boundaries inhibits the diffusion of copper in the grain boundaries, and serves other important roles. Therefore, if the reliability of the wiring is taken into account, there are instances to be considered wherein the concentration of the metallic element in the grain boundaries might desirably be used as an index. However, the concentration in the grain boundaries is regarded as being in accord with the average concentration in the copper (i.e., if the average concentration in the copper is high, the concentration in the grain boundaries will also be high). Accordingly, the concentration is stipulated in the present application using the average concentration in the copper. Also, according to methods for forming copper alloys, a concentration distribution sometimes occurs in the via. However, even in such instances, the concentration of the metallic element in the via similarly refers to the average concentration of the corresponding metallic element in the via. Examples of methods for measuring the average concentration in the vias include mapping using an energy dispersive x-ray analysis device (EDX) to map the metal concentration in the vias; however, there are no particular limitations as regards the method.

First Embodiment

Next, the wiring structure in the semiconductor device according to a first aspect of the present invention will be described-in detail based on an embodiment shown in FIG. 1.

As mentioned above, the semiconductor device according to the first embodiment is wherein the dual damascene wiring positioned in at least one layer constituting the multilayered wiring that is formed in the prescribed area in the insulating film that is formed above the semiconductor substrate is made from an alloy in which copper is a principal component. Further, the concentration, in the vias associated with the dual damascene wiring, of at least one metallic element contained in the alloy as the added component changes in response to the difference in width of the wiring of the upper layer where the vias are connected. A larger width of the corresponding upper level wiring corresponds to a higher concentration of the added component metallic element in the connecting via.

FIG. 1 is a cross-sectional view schematically showing a structure of the semiconductor device according to the first embodiment of the present invention. In the embodiment shown in FIG. 1, an inter-layer insulating film 2, an etch stop film 3a, and an inter-layer insulating film 4a are layered in the stated order on the semiconductor substrate 1 (not shown) on which the semiconductor element is formed. A barrier metal film 5a and wiring 6 composed of copper or copper alloy are formed in a prescribed position within the inter-layer insulating film 4a, and pass through the corresponding films. A wiring structure is formed whereby an upper surface of the wiring is covered by a wiring overcoat 7a. An inter-via layer insulating film 8, an etch stop film 3b, and an inter-layer insulating film 4b are layered in the stated order on an upper layer of the wiring overcoat 7a. A barrier metal film 5b and dual damascene wires 9a, 9b, 9c comprising copper or a copper alloy are formed in a prescribed position within the upper layer, passing through these films. A wiring structure is formed, with the surface of the wiring covered by a wiring overcoat 7b. "Dual damascene wiring 9a" herein refers to wiring comprising a connected body having wiring 9a1 and via part 9a2 (similarly, "dual damascene wiring 9b" refers to wiring comprising a connected body having wiring 9b1 and a via part 9b2, and "dual damascene wiring 9c" refers to wiring comprising a connected body having wiring 9c1 and a via part 9c2). However, in this embodiment, the wirings 9a1, 9b1, 9c1 have different widths and are arranged in order of increasing width, as shown in the drawing. Therefore, the concentration of the metallic element contained as an added component in the copper alloy of via parts 9a2, 9b2, 9c2 that are connected to each of these wirings are arranged in increasing order of concentration. Specifically, a larger width of the wiring on the upper layer where the via is connected corresponds to a higher concentration of the metallic element contained as an added component in the copper alloy. The present invention is not limited by the method for forming dual-damascene grooves used to form these dual damascene wirings.

The etch stop films 3a, 3b can be formed using at least one of, e.g., an $SiO_2$ film, an SiN film, an SiC film, an SiCN film, an SiOC film, an SiOCH film, a film that contains these films and an organic material, a film having an organic material as a principal component, and a film that contains SiO together with a film having an organic material as a principal component. These films are provided to improve the ability of working wiring grooves in the dual-damascene configuration and the via-holes, and may be modified according to the material that is to be worked.

Examples of typical films that can be used for the inter-via layer insulating film 8 include $SiO_2$, SiC, SiCN, or HSQ (hydrogen silsesquioxane) films (e.g., Type 12 (Tokyo Ohka Kogyo Co., LTD.)), MSQ (methyl silsesquioxane) films (e.g., JSR-LKD (JAR), ALCAP (Asahi Kasei), NCS (Catalysts & Chemicals Ind. Co., LTD.), IPS (Catalysts & Chemicals Ind. Co., LTD.), and HOSP (Honeywell) films), organopolymer films (e.g., SiLK by The Dow Chemical Company) and Flare (Allied Signal, Inc.), and SiOCH or SiOC films (e.g., Black Diamond (Applied Materials, Inc.), CORAL (by Novellus Systems, Inc.), Aurora ULK (Ultra Low-k; ASM International), Orion (Tricon Technologies, Inc.); insulating thin films containing such films and an organic material; films obtained by layering a plurality of such films; and films obtained by modifying the density or composition of any of such films in the thickness direction.

The barrier metal films 5a, 5b can be formed, e.g., by sputtering, CVD, ALCVD (atomic layer chemical vapor deposition). For example, tantalum (Ta), tantalum nitride (TaN), titanium nitride (TiN), tungsten carbonitride (WCN), other metals having high melting points, and nitrides thereof; or films obtained by layering these films may be used. Ta/TaN (upper/lower layer) layered films are particularly preferred.

The dual damascene wiring $9a$, $9b$, $9c$; i.e., the wiring $9a1$, $9b1$, $9c1$ and the via parts $9a2$, $9b2$, $9c2$, are formed using a copper alloy as described above. The copper alloy is formed by sputtering using an alloy target, CVD, or an electrolytic plating method in which a film formed by one of the above methods is used as an electrode. Also, the metallic element contained in the copper alloy as an added component can form a solid solution in the copper, which is a principal component of the alloy. Metals that are suitable for use as the metallic element are ones that, when added, suppress self-diffusion of the copper and the diffusing of voids in the copper. Specific examples of such metals include those that have the effect of stabilizing the grain boundaries of the metal used as a principal component; those that migrate more preferentially than a principal component metal while having the effect of slowing the incidence of migration of the metal used as the principal component; those that prevent the oxidation of the metal used as a principal component in the alloy wiring, i.e., that oxidize more readily than the metal used as the principal component; and those that oxidize to form a stable oxidized film on the surface of the wiring, and prevent oxygen from penetrating into the alloy wiring.

Specifically, at least one metal is preferably selected from the group consisting of titanium, tungsten, aluminum, tin, silver, zirconium, silicon, and magnesium.

When two or more types of metallic elements are used as the added metal, then at least one of the metallic elements used may be one that will be present in higher concentrations if the wiring of the upper layer where the vias are connected is wider. The other of the metallic elements used may be present in the same concentration in the vias, or, as with the first metallic element, may be one that will be present in higher concentrations if the wiring of the upper layer is wider. Conversely, the other of the metallic elements used may be one that is present in low concentrations in the vias if the wiring of the upper layer is wider, although this will depend on the combination of the types of metal used.

In particular, methods for forming the copper alloy used in the wiring and the via parts may involve ionized sputtering using a copper-aluminum alloy target that contains 0.5 to 2.0 at % of aluminum in the copper target to form a copper-aluminum alloy seed film, and embedding the copper by electrolytic plating using these as electrodes.

If the alloy seed layer and electrolytic plating are combined, the concentration of the metallic element in the alloy wiring and vias will be equal to or less than the concentration in the alloy target. The concentration of the added metallic element in the copper in the vias is preferably equal to or less than the limit of the solid solubility of the metallic element with regard to the copper, or 1.0 at % or less. The associated reasoning is that if the metallic element is added in a concentration that is equal to or greater than this level, the via parts will have extremely high resistance, and the alloy will be unsuitable for use as conductive wiring.

Several examples shall be discussed below in detail in embodiments of specific methods for using different concentrations of the added metallic element in the copper alloy in the via parts, with the concentration of the metallic element being higher when the wiring in the upper layer where the vias are connected is wider, as desired hereinabove. The wiring configurations can be formed by relatively simple procedures. It is possible to dispense with complicated procedures in copper alloys for filling in via parts are prepared separately and with different concentrations of the added metallic element, and are then used to fill in the via parts.

Specifically, the following procedure is performed in order for the configuration to be formed using copper alloys having different concentrations of the added metallic element in each via part. The starting materials are substantially a copper alloy (A) in which a metallic element of a specific concentration has been compounded, and copper or a copper alloy (B) having a lower concentration of the given metallic element than in copper alloy (A). With systematic use being made of the fact that the wiring with which the via parts are connected has different widths, the copper alloy (A) is filled into individual via parts in different amounts, and the copper alloy or copper (B) is filled in the via parts complementarily with regard to the copper alloy (A). Through heat-diffusion or another process, the added metallic elements are diffused and the concentration is made uniform in the via parts between the layer formed from the copper alloy or copper (B) and the layer formed from the copper alloy (A). As a result, the concentration of the added metallic element can be made different for each via.

The wiring sites (e.g., site 6 in FIG. 1) other than the dual damascene wiring $9a$, $9b$, $9c$ are formed from copper or a copper alloy, but these can also be formed by sputtering, CVD, plating, or another method.

Examples of films that can be used for wiring overcoats $7a$, $7b$ include at least one from among the following: SiN, SiC, SiCN, SiOC, and SiOCH films; films that contain these films and an organic material; films having an organic material as a principal component; and films that contain SiO together with a film having an organic material as a principal component.

When the above wiring structure is used, stress-induced voids that are formed in the vias of the dual damascene wiring can be efficiently minimized without raising the electrical resistance of the wiring more than necessary. Specifically, the concentration of the metallic element added to the Cu is lower in vias connected to wiring having a relatively narrow width, which tend to be less prone to failure, whereas the concentration of metallic elements added to the Cu tends to be higher in vias connected to wiring of relatively wide width, which are more prone to failure.

Figure 2:
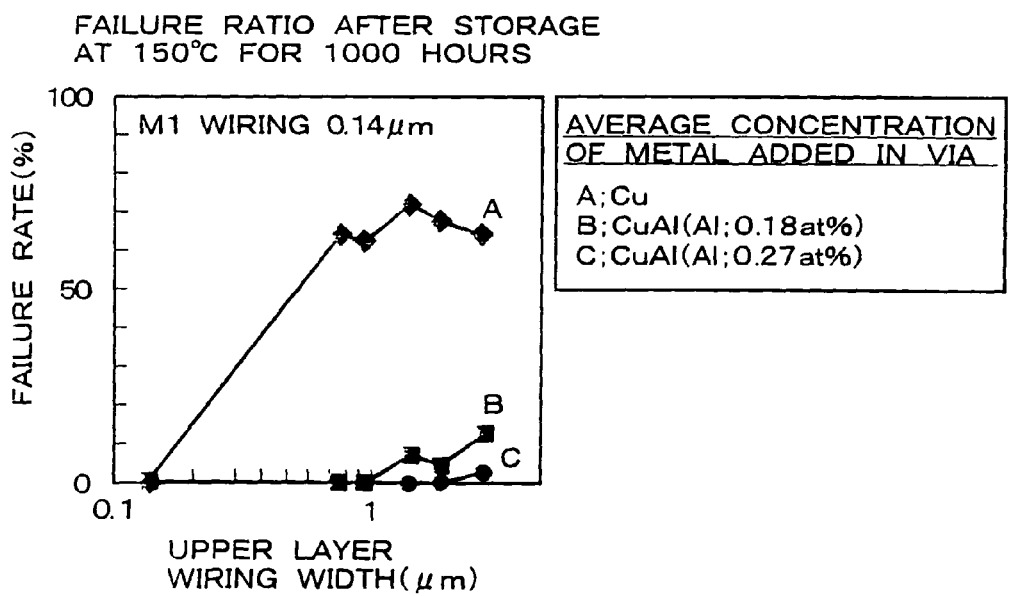
FIG. 2 is a diagram that shows the failure rate due to stress-induced voids in the wiring.

FIG. 2 shows the results of a constant-temperature storage test performed by the inventors to examine the optimal range of concentrations of the added metallic element in the copper alloy. The test, which was performed at 150° C. for 1000 hours, involved varying the concentration of the added metallic element in the copper in the wiring. The via diameter of the wiring used in the measurement was 100 nm. The horizontal axis shows the wiring width on the upper layer where the vias are connected, and the vertical axis shows the failure rate. The failure rate is the percentage of all chips on the wafer surface whose electrical resistance rose 10% or more above the value prior to the test. An increase in resistance mainly occurs when voids were formed in the copper or copper alloy in the wiring. The results in the drawing are A:Cu, B:CuAl (Al:0.18 at %), and C:CuAl (Al:0.27 at %; the concentration in the parentheses shows the average Al concentration in the vias). It is apparent from the results that a higher Al concentration in the Cu in a via correlate with a lower incidence of failure. However, when the Al concentration rises, the specific resistance of the Cu also increases; therefore, the concentration is preferably established at or below a level that is adequate for ensuring reliability. In the instance shown in FIG. 2, A (no Al added to the Cu) exhibited no failure only at the narrowest wiring width of 0.14 μm, but failure occurred when the width of the wiring was greater. When B (CuAl alloy) was used, failure did not occur until the wiring width was 1.0 μm. When C (CuAl alloy) was used, failure did not occur until the wiring width was 2 μm. The above results illustrate that when the wiring structure has 100-nm vias in which a CuAl alloy is used, Al does not need to be added to the Cu in via parts connected to narrow wiring (0.14 μm or less). However, adding about 0.18 at % of Al to via parts connected to wiring that is wider than 0.14 μm, adding about 0.27 at % of Al to via parts connected to wiring that is wider than 1.0 μm, and continuing to increase the Al concentration in stages for each increase in width will ensure reliability, while also allowing rises in resistance to be suppressed in locations where the vias are connected to relatively narrow wiring. The optimal added metallic element concentration will vary according to the process used to form the wiring, but failure typically occurs more readily in vias connected to wide wiring. Therefore, it is apparent that the object of the present invention can be achieved by using a higher concentration in vias connected to wiring of larger widths.

The wiring structure as described above of the semiconductor device according to the present invention can readily be confirmed in articles manufactured therefrom. Specifically, the structure can be confirmed by measuring the metal concentration in the wiring vias when at least one part has (multilayered) wiring in the following products: semiconductor products that have DRAM (dynamic random access memory), SRAM (static random access memory), flash memory, FRAM (ferroelectric random access memory), MRAM (magnetic random access memory), variable-resistance memory, and other types of memory circuits; semiconductor products that have microprocessors or other logic circuits; hybrid semiconductor products in which both of these are used; or SIP (silicon in package) having a plurality of layers of such semiconductor devices. Specifically, the Cu of a via part can be analyzed using a transmission electron microscope (TEM) that cuts the semiconductor product in a cross-sectional direction, and the concentration of metal in the via can be analyzed by EELS (electron energy-loss spectroscopy) and EDX (energy-dispersive x-ray spectroscopy) in addition to TEM. The concentration can be precisely detected in particular from the contrast of the TEM image by identifying the grain boundaries in the metal wiring, and performing an elemental analysis on the grain boundaries and the vicinities thereof. With samples that are cut horizontally, the metallic element can be confirmed by selecting a prescribed location and performing SIMS (second ion mass spectroscopy) or another elemental analysis.

Second Embodiment

Next, the wiring structure in a semiconductor device according to a second embodiment of the present invention will be described in detail with reference to the structure of the first embodiment shown in FIG. 1.

The semiconductor device of the second embodiment is wherein in a dual damascene wiring disposed on at least one layer that constitutes a multilayered wiring formed in a prescribed region of an insulating film formed above a semiconductor substrate, the dual damascene wiring is composed of an alloy having copper as a principal component, and the concentration of at least one metallic element contained as an added component of the alloy in a via associated with the dual damascene wiring is at least 10% higher in vias connected to wiring that is five or more times wider than the diameter of the via, than the concentration of the element in vias connected to wiring of the smallest width in the same wiring layer.

As mentioned above, FIG. 1 is a cross-sectional view schematically showing the structure of the semiconductor device according to the first embodiment of the present invention. However, in the semiconductor device of the second embodiment, the relationships between the concentrations of metallic elements added to the Cu in the vias are different from those in the semiconductor device of the first embodiment.

As described above, the widths of wirings $9a1$, $9b1$, $9c1$ in the dual damascene wirings $9a$, $9b$, $9c$ are individually different, and increase in width in the stated order.

Therefore, the wiring $9c1$ is five or more times wider than the diameter of via parts $9a2$, $9b2$, $9c2$. If the widths of wirings $9a1$, $9b1$ are less than five times the diameter, the concentration of the metallic element as an added component in the Cu of the via part $9c2$ (Cwide) is at least 10% higher than the concentration of the given metallic element in a via part connected to the narrowest-width wiring in the same wiring layer (Cmin; where Cwide≥1.10 Cmin).

Using this kind of wiring structure makes it possible to efficiently minimize failures that become far more common when the wiring is at least five times wider than the diameter of the vias connected thereto. Specifically, if failures substantially do not occur in via parts connected to wiring of a fixed width or less, but occur more often in the via parts connected to wiring of a fixed width or greater, a wiring structure whereby the added metallic element concentration is gradually increased in accordance with the wiring width, such as with the first embodiment, is not adopted, and a wiring structure whereby the concentration of the added metallic element component is increased only in via parts connected to wiring of a fixed width or greater, such as in the second embodiment, is used. Accordingly, rises in electrical resistance are suppressed, and reliability can be increased.

Figure 3:
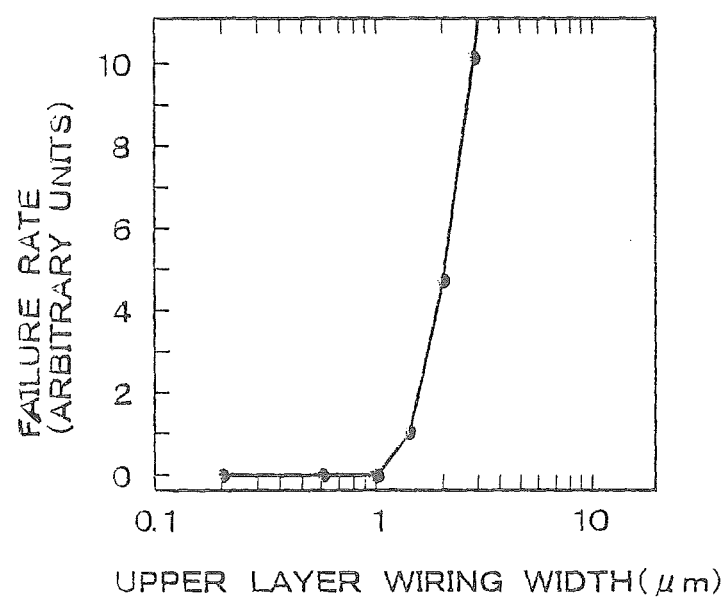
FIG. 3 is a diagram that shows the failure rate due to stress-induced voids in the wiring.

The findings described hereunder form the basis for the above phenomenon. Specifically, experiments have shown that when the width of wiring connected to a via increases, the incidence of stress-induced voids forming in the via increase to or in excess of a certain threshold width, and that the threshold width is about five times the diameter of the via. FIG. 3 shows the incidence of failure derived from stress-induced voids in a via when the width of wiring connected thereto is varied (non-patent document 3). Accordingly, failures did not occur when the wiring width on the upper layer where 0.2-μm vias were connected was 1 μm or less, but when the wiring width was greater than 1 μm, the failure rate suddenly increased. The dependency of the failure rate on the wiring width shown in association with the first aspect (A in FIG. 2) differs from the tendency in FIG. 3, but this is influenced by the fact that the via diameter and processes are different.

In the second embodiment, there are no particular limitations as to the added metallic element concentration in the via parts $9a2$, $9b2$ connected to wiring whose width is less than five times the diameter of the vias. The concentration may be equal to the concentration of the metallic element in via parts connected to the narrowest width wiring in the same wiring layer (Cmin), or higher than the concentration (Cmin) in a range wherein the wiring resistance of the wiring is not unnecessarily increased.

In the semiconductor device of the second embodiment, the materials that constitute each member and the method for forming these members are substantially the same as in the semiconductor device of the first embodiment, wherefore a description thereof has been omitted. The relationship between the concentrations of the added metallic elements among the vias in the semiconductor device of the second embodiment and those in the semiconductor device of the first embodiment differs as described above, but a substantially similar formation process may be employed. Specifically, the following technique can be adopted in such instances. The starting materials are a copper alloy (A) in which metallic elements of specific concentrations are combined, and a copper alloy or copper (B) whose concentration of the corresponding metallic elements is lower than in the first copper alloy. The fact that wiring connected to the via parts have different widths is adopted as part of the process, and the copper alloy (A) is filled into each via in different amounts, while the via parts are filled with copper alloy or copper (B) complementarily with regard to the copper alloy (A). Heat diffusion or the like is used to form layers in the via parts from the copper alloy (A) and from the copper alloy or copper (B), with the concentration of the added metallic elements between the layers intended to be made uniform. As shall be described in detail in the example below, the volume ratio of the copper alloy (A) filled into the via parts is only slightly changed from that in the first aspect. Further, the method for analyzing a product having a wiring structure such as the one described above in the case of a semiconductor device according to the second aspect may be the same as the one used in accordance with the first aspect, for which reason a description thereof has been omitted.

When using the above wiring structure, stress-induced voids formed in the vias in the dual damascene wiring may be efficiently minimized without raising the electrical resistance of the wiring more than necessary. Specifically, the concentration of the metallic element added to the Cu is lower in vias connected to wiring having a relatively narrow width, which tend to be less prone to failure, whereas the concentration of metallic elements added to the Cu tends to be higher in vias connected to wiring of relatively wide width, which are more prone to failure.

Below, the present invention will be specifically described based on examples.

EXAMPLE 1

An example of the semiconductor device and method for manufacturing the device according to the first aspect, which is shown as the first embodiment above, will be described in detail with reference to the cross-sectional view of the wiring shown in FIG. 4.

Figure 4A:
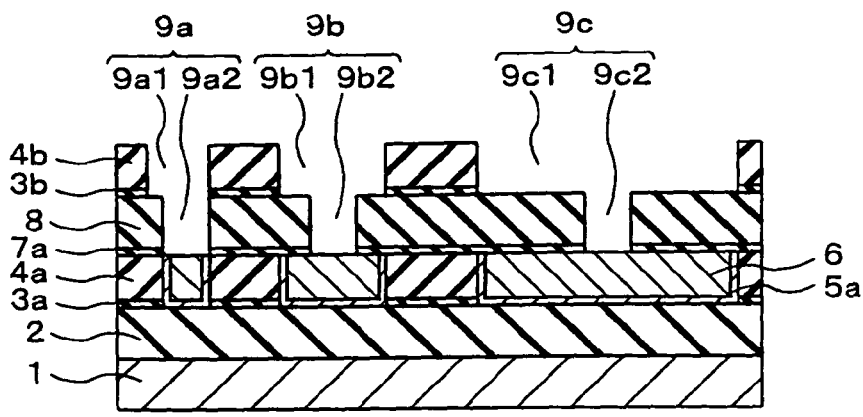
FIGS. 4A to 4D are cross-sectional views of the semiconductor device in steps according to the method for manufacturing Embodiment 1.
Figure 4B:
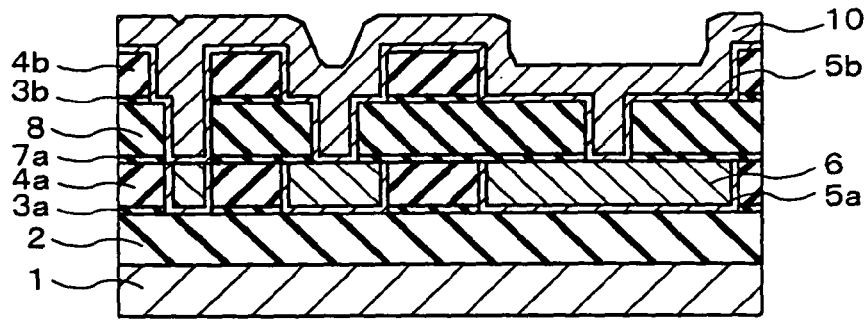
Figure 4C:
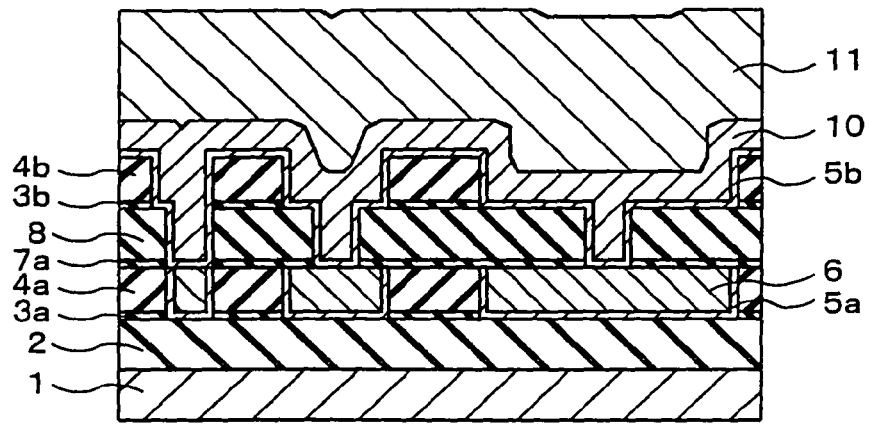
Figure 4D:
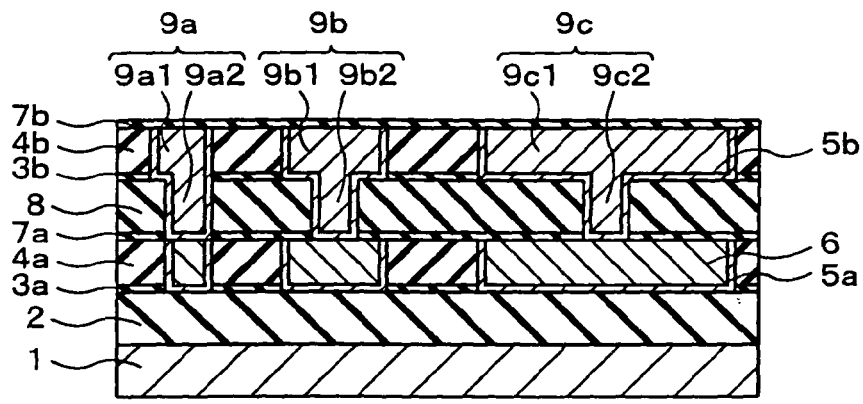

As shown in FIG. 4A, an inter-layer insulating film 2, an etch stop film 3a, and an interlayer insulating film 4a are layered in the stated order on a semiconductor substrate on which a semiconductor element (not shown) is formed. A barrier metal film 5a and a wiring 6 comprising copper or a copper alloy are formed in prescribed locations within the inter-layer insulating film 4a in wiring grooves formed through the films using a known etching or patterning method. On the upper surface of the wiring is formed a lower-layer wiring structure covered by a wiring overcoat 7a. An inter-via-layer insulating film 8, an etch stop film 3b, and an inter-layer insulating film 4b are layered in the stated order on the upper layer. Grooves for forming via parts 9a2, 9b2, 9c2 and wirings 9a1, 9b1, 9c1, which are obtained by a dual damascene process, are formed through the films in prescribed locations therein using a known etching or patterning method. Via parts 9a2, 9b2, 9c2 each have the same diameter, but the widths of wirings 9a1, 9b1, 9c1 are each different, and increase in width in the stated order. Next, as shown in FIG. 4B, the barrier metal film 5b and the copper film 10 are formed in the grooves of the dual damascene wiring 9a, 9b, 9c. Methods such as sputtering, CVD, and plating can be used to form the copper film 10. The thickness of the copper film 10 is less than needed to completely cover all of the wiring; i.e., is set to be less than the thickness of the insulating film 4b between the wiring layers. Thus, grooves having wide wiring will result in less area being covered by the copper film 10. Next, as shown in FIG. 4C, a copper alloy film 11 is formed on the copper film 10 by sputtering, plating, CVD or another method. The copper alloy film 11 completely covers the grooves used for wirings 9a, 9b, 9c, and is formed to a thickness that is sufficient for chemical mechanical polishing (CMP) to be performed in order to flatten the surface. At least one element selected from titanium, tungsten, aluminum, tin, silver, zirconium, indium, silicon, and magnesium can be used as the added metallic element contained in the copper alloy film 11. The concentration of the metallic element in the copper alloy film 11 is preferably 1.0 at % or less if wiring delay is taken into account. A heat treatment is then carried out to such an extent that the added metallic element in the copper alloy film 11 diffuses into the copper film 10 to reach the vias. As shown in FIG. 4C, the openings of the via parts 9a2, 9b2, 9c2 and the distance of the copper alloy film 11 in the depth direction differ depending on the wiring width. Therefore, the concentration of the added metallic element in the via part 9c2 connected to the wide wiring 9c1 is higher than in the via part 9a2 connected to the narrow-width wiring 9a1. Next, as shown in FIG. 4D, prescribed amounts of the copper alloy film 11 and the copper film 10, in which the added element in the copper alloy film 11 has been diffused, are removed by chemical mechanical polishing or another technique, and a wiring is formed. A wiring overcoat 7 is subsequently formed.

As a result, the concentrations of the metallic element contained as an added component in the copper alloy in the via parts 9a2, 9b2, 9c2 connected to the wirings in a respective manner increase in the stated order. Specifically, a greater wiring width on the upper layer where the vias are connected corresponds to a higher concentration of the metallic element contained as an added component in the copper alloy. Based on the above, it is possible to obtain a wiring structure whereby the concentration of the metallic element added to the Cu is lower in vias connected to wiring having a relatively narrow width, which tend to be less prone to failure, whereas the concentration of metallic elements added to the Cu tends to be higher in vias connected to wiring of relatively wide width, which are more prone to failure. The reliability can accordingly be raised without compromising the high speed of the wiring more than necessary.

EXAMPLE 2

An example of a semiconductor device and method for manufacturing the device according to the second aspect, which is shown as the second embodiment above, will be described in detail with reference to the cross-sectional view of the wiring shown in FIG. 5.

Figure 5A:
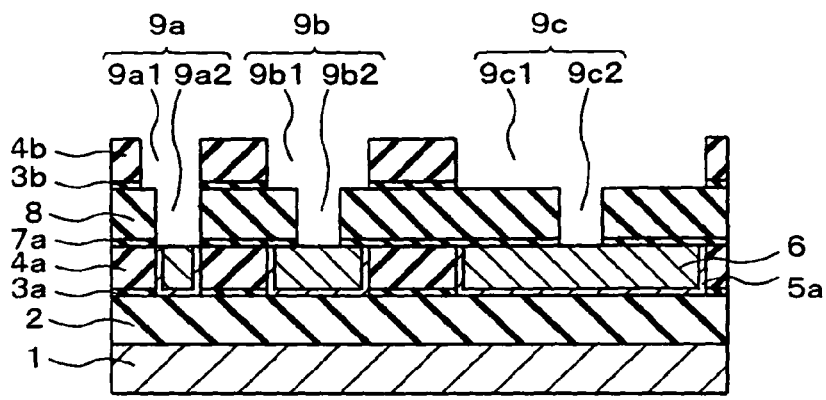
FIGS. 5A to 5D are cross-sectional views of the semiconductor device in steps according to the method for manufacturing Embodiment 2.
Figure 5B:
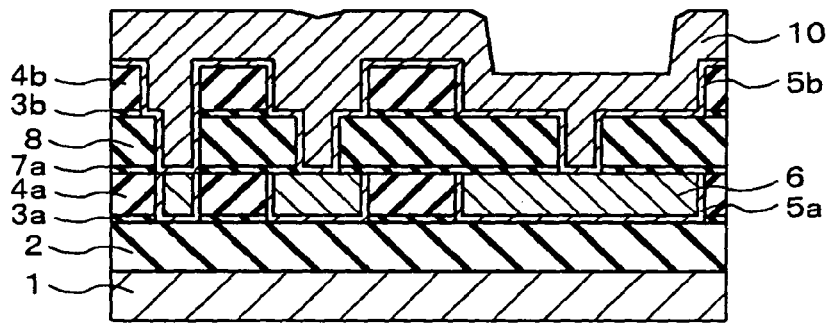
Figure 5C:
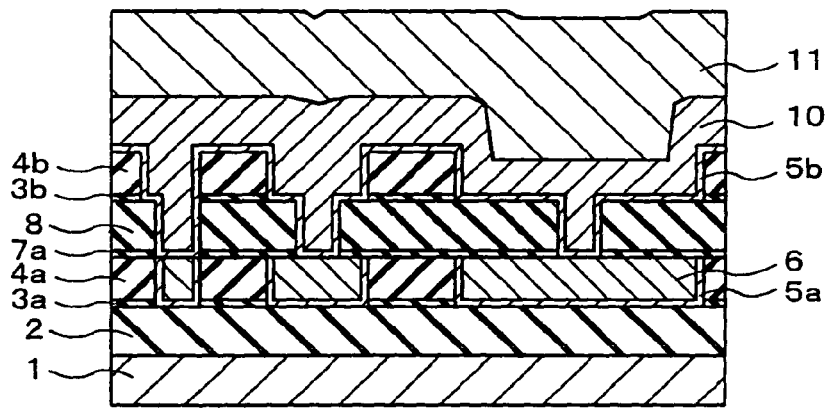
Figure 5D:
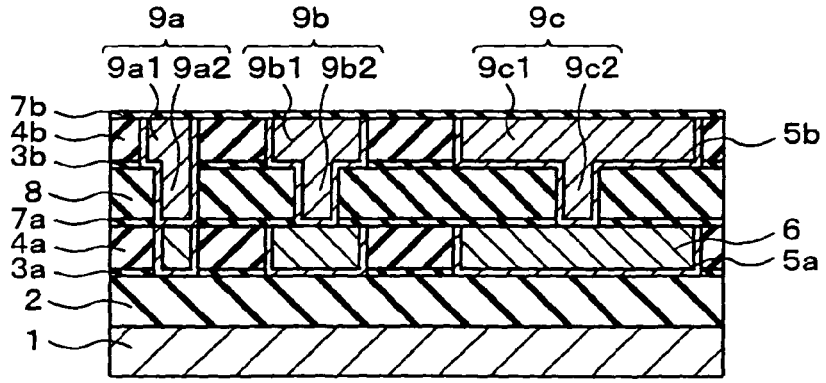

As shown in FIG. 5A, an inter-layer insulating film 2, an etch stop film 3a, and an interlayer insulating film 4a are layered in the stated order on a semiconductor substrate on which a semiconductor element (not shown) is formed. A barrier metal film 5a and a wiring 6 comprising copper or a copper alloy are formed in prescribed locations within the inter-layer insulating film 4a in wiring grooves formed through the films using a known etching or patterning method. A wiring structure of a lower layer covered by a wiring overcoat 7a is formed on the upper surface of the wiring. An inter-via-layer insulating film 8, an etch stop film 3b, and an inter-layer insulating film 4b are layered in the stated order on the upper layer. Grooves for forming via parts 9a2, 9b2, 9c2 and wirings 9a1, 9b1, 9c1, which are obtained by a dual damascene process, are formed through the films in prescribed locations therein using a known etching or patterning method. Via parts 9a2, 9b2, 9c2 each have the same diameter, but the widths of wirings 9a1, 9b1, 9c1 are different from one another, and increase in the stated order. The wiring 9c1 in particular is five or more times wider than the via diameter. Next, as shown in FIG. 5B, the barrier metal film 5b and the copper film 10 are formed in the grooves of the dual damascene wiring 9a, 9b, 9c. Sputtering, CVD, plating, and other methods can be used to form the copper film 10. The copper film 10 is less thick than the inter-wiring layer insulating film 4b, but with narrow-width wiring, in which stress-induced voids are not formed, the wiring grooves are completely filled in and covered by the copper film 10. For example, if the via parts 9a2, 9b2, 9c2 have a diameter of 0.13 µm, and the wirings 9a1, 9b1, 9c1 have widths of 0.15 µm, 0.3 µm, and 1.0 µm, respectively, the differences between the via diameter and the wiring width in the wiring 9a1 and 9b1 are relatively small. Therefore, stress-induced voids substantially do not form in via parts 9a2 and 9b2, but the difference between the via diameter and the wiring width in the wiring 9c1 is large. Accordingly, stress-induced voids tend to form in the via part 9c2. The film thickness of the copper film 10 is set to 1.5 µm or greater, and less than the thickness of the inter-wiring layer insulating film 4b, whereby the grooves of the dual damascene wiring 9a, 9b are completely filled in and covered by the copper film 10, and some of the grooves in the dual damascene wiring 9c are not covered. Next, as shown in FIG. 5C, a copper alloy film 11 is formed on the copper film 10 by sputtering, plating, CVD, or another method. The copper alloy film 11 completely covers the dual damascene wiring 9c that was not completely covered by the copper film 10, and is sufficiently thick for CMP over the entirety of the wafer. At least one element selected from titanium, tungsten, aluminum, tin, silver, zirconium, indium, silicon, and magnesium can be used as the added metallic element contained in the copper alloy film 11. The concentration of the metallic element in the copper alloy film 11 is preferably 1.0 at % or less if wiring delay is taken into account. A heat treatment is then carried out to such an extent that the added metallic element in the copper alloy film 11 diffuses throughout the copper film 10 to reach into at least the via part 9c2. As shown in FIG. 5C, the openings of the via parts 9a2, 9b2, 9c2 and the depths of the copper alloy film 11 differ depending on the wiring width. Therefore, the concentration of the added metallic element in the via part 9c2 connected to the wide wiring 9c1 is higher than in the via parts 9a2, 9b2. A very small amount of the added metallic element in the via parts 9a2, 9b2 diffuses during the heat treatment, but the concentration does not increase to the level in the via part 9c2 connected to the wiring 9c1, which is not completely covered by the copper film 10. Next, as shown in FIG. 5D, prescribed amounts of the copper alloy film 11 and the copper film 10 in which the added metallic element in the copper alloy film 11 has been diffused are removed by chemical mechanical polishing or another technique, and a wiring is formed. A wiring overcoat 7 is subsequently formed.

If failures become much more common in via parts connected to wiring whose width is five or more times greater than the via diameter, such as shown in the second embodiment, then using the wiring structure obtained as described above will allow a metallic element of relatively high concentration to be added to such via parts. Furthermore, the amount of metallic element added to vias connected to small-width wiring, which is not readily prone to failure, can be reduced; therefore, reliability can be increased without compromising the high speed of the wiring more than necessary.

EXAMPLE 3

Another example of a semiconductor device and a method for manufacturing the device according to the first aspect, which is shown as the first embodiment above, will be described in detail with reference to the cross-sectional view of the wiring shown in FIGS. 6A-6D.

Figure 6A:
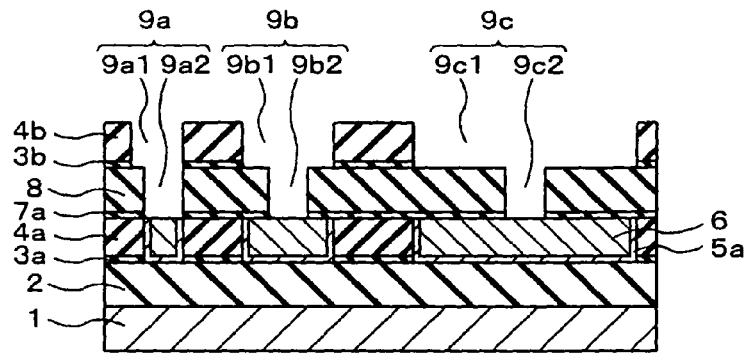
FIGS. 6A to 6D are cross-sectional views of the semiconductor device in steps according to the method for manufacturing Embodiment 3.

As shown in FIG. 6A, an inter-layer insulating film 2, an etch stop film 3a, and an interlayer insulating film 4a are layered in the stated order on a semiconductor substrate on which a semiconductor element (not shown) has been formed. A barrier metal film 5a and a wiring 6 comprising copper or a copper alloy are formed in prescribed locations within the inter-layer insulating film 4a in wiring grooves formed through the films using a known etching or patterning method. A wiring structure of a lower layer covered by a wiring overcoat 7a is formed on the upper surface of the wiring. An inter-via-layer insulating film 8, an etch stop film 3b, and an inter-layer insulating film 4b are layered in the stated order on the upper layer. Grooves for forming via parts 9a2, 9b2, 9c2 and wirings 9a1, 9b1, 9c1, which are obtained by a dual damascene process, are formed through the films in prescribed locations therein using a known etching or patterning method. The via parts 9a2, 9b2, 9c2 each have the same diameter, but the widths of the wirings 9a1, 9b1, 9c1 are different from one another, and increase in the stated order.

Figure 6B:
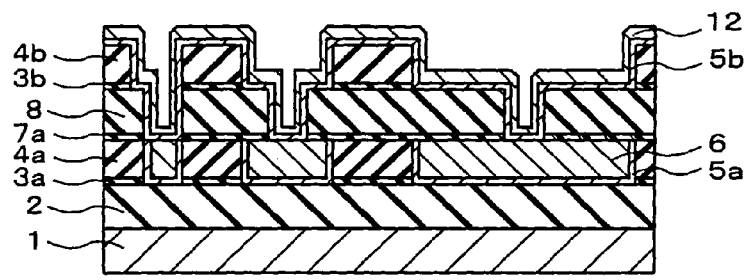
Figure 6C:
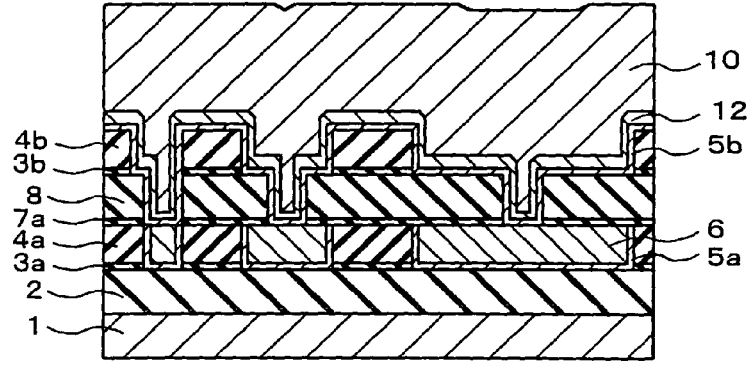
Figure 6D:
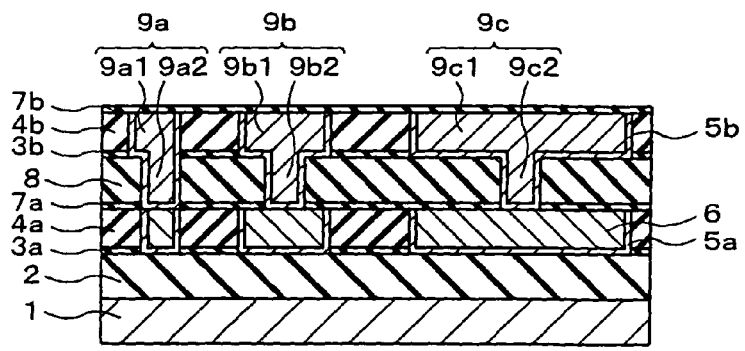

Next, as shown in FIG. 6B, a barrier metal film 5b and a copper alloy seed film 12 are formed in grooves of dual damascene wiring 9a, 9b, 9c. At least one metal selected from titanium, tungsten, aluminum, tin, silver, zirconium, indium, silicon, and magnesium can be used as the added metallic element contained in the copper alloy seed film 12. The concentration of the metallic element in the copper alloy seed film 12 is preferably 1.0 at % or less if wiring delay is taken into account. Sputtering is used to form the copper alloy seed film 12. Sputtered particles tend not to reach very small vias connected to narrow-width wiring; therefore, the ability for the copper alloy seed film 12 to serve as a cover increases inside the vias connected to wide wiring. In particular, raising the pressure within the chamber during sputtering results in a shortening of the mean free path of the sputtered particles, and allows this tendency to be enhanced. This technique enables more of the copper alloy seed film to accumulate in vias connected to wide wiring. Next, as shown in FIG. 6C, a copper film 10 is formed on the copper alloy seed film 12 by sputtering, plating, CVD, or another method. The thickness of the resulting copper film 10 allows the wirings 9a, 9b, 9c to be completely covered, and is sufficient for CMP. A heat treatment is then performed in order to minimize the growth of particles and defects in the copper film 10. As a result, the coverage of the copper alloy seed film 12 in the via parts 9a2, 9b2, 9c2 differs according to the width of the wiring connected to these vias. Therefore, the concentration of the added element in the via part 9c2 connected to the wide wiring 9c1 becomes higher than the concentration of the via part 9a2 connected to the narrow wiring 9a1. Next, as shown in FIG. 6D, prescribed amounts of the copper film 10 and the copper alloy seed film 12 are removed by chemical mechanical polishing or another technique, and a wiring is formed. A wiring overcoat 7b is then formed.

The result is that the concentrations of the metallic elements contained as added components in the copper alloy in the via parts 9a2, 9b2, 9c2 connected to the wirings rise in the stated order. Specifically, larger-width wiring on the upper layer where the vias are connected corresponds to a higher concentration of the metallic element contained as an added component in the copper alloy. Based on the above, it is possible to obtain a wiring structure whereby the concentration of the metallic element added to the Cu is lower in vias connected to wiring having a relatively narrow width, which tend to be less prone to failure, whereas the concentration of metallic elements added to the Cu tends to be higher in vias connected to wiring of relatively wide width, which are more prone to failure. The reliability can accordingly be raised without compromising the high speed of the wiring more than necessary.

EXAMPLE 4

A further example of a semiconductor device and method for manufacturing the device according to the first aspect, which is shown as the first embodiment above, shall be described in detail with reference to the cross-sectional view of the wiring shown in FIG. 4. This example shows an instance in which two types of metallic elements are added to the copper in Example 1.

The structure shown in FIG. 4C is formed using the same procedure described in Example 1. Prescribed amounts of the copper alloy film 11 and the copper film 10 in which the added element in the copper alloy film 11 has been diffused are then removed by chemical mechanical polishing, and a wiring is formed. Next, a gas that contains metal is directed on a wafer surface, and a metallic element (metallic element M2) is added from the surface of the wirings 9a1, 9b1, 9c1. This metallic element is different from the metallic element (metallic element M1) contained in the copper alloy film 11. A wiring overcoat 7 is then formed, and the structure shown in FIG. 4D is obtained. If the height of the wiring is uniform throughout the entire wafer surface when this method is employed, the metallic element M2 will be added uniformly on the surface of the wafer, regardless of the wiring width or via diameter (the amount will vary somewhat in the depth direction of the wiring, but will be fixed along the wafer surface). As described in Example 1, if the wiring is wider on the upper layer where the vias are connected, the concentration of the metallic element M1 in the vias will be higher.

The metallic element M2 is added uniformly from the wafer surface as described above, and, as shown in Example 1, a structure is used in which the amount of the metallic element M1 in the vias changes according to the width of the wiring to which the vias are connected. Not only is the diffusion of copper thereby minimized in the wiring surface interface, but the formation of voids in the vias can also be prevented. The diffusion of copper in the interface must be minimized irrespectively of the wiring width. Therefore, the metallic element M2 may be uniformly added to the interface, but diffusion of the copper in the via is unlikely to occur if the wiring connected to the vias is narrow. Accordingly, the concentration of the metallic element M1 within the vias must be changed according to the wiring width so that the high speed of the wiring will not be compromised.

INDUSTRIAL APPLICABILITY

The present invention is useful in minimizing increases in the resistance of multilayered wiring in which copper is a principal component, reducing the incidence of stress-induced voids therein, and improving the reliability thereof.

The invention claimed is:

1. A method for manufacturing a semiconductor device, said method comprising:

forming grooves and vias in order to form a plurality of dual damascene wirings in a prescribed area within an insulating film formed above a semiconductor substrate;

forming a diffusion prevention layer on a surface of the grooves and vias;

forming a lower-layer copper or copper alloy film on the diffusion prevention layer to a thickness that is less than a thickness allowing for a complete filling of all vias connected to a wiring of said wirings, disposed in the grooves, that is five or more times as wide as a via diameter, and is equal to or greater than a thickness allowing for a complete filling of all vias connected to another wiring of said wirings, disposed in the grooves, that is less than five times as wide as the via diameter;

forming on the lower-layer copper or the copper alloy film another copper alloy film comprising a copper alloy that comprises an added metallic element in a concentration that is higher than that of the added metallic element in the copper or the copper alloy film, the another copper alloy film filling a remaining part of the grooves above the wiring and extending below an upper surface of the lower-layer copper or the copper alloy film above said another wiring; and heating the added metallic element contained in the another copper alloy film to diffuse throughout the lower-layer copper or the copper alloy film.

2. The method for manufacturing the semiconductor device according to claim 1, further comprising:

disposing said insulating film between adjacent wirings of said wirings; and forming another plurality of wirings below said dual damascene wirings and above an inter-layer insulating film disposed on the semiconductor substrate, wherein each of said vias has a same diameter, wherein widths of said adjacent wirings are different from one another, and wherein a concentration of the added metallic element in one of the vias connected to the wiring of said wirings is higher than a concentration of the added metallic element in another one of the vias connected to said another wiring of said wirings.

3. The method for manufacturing the semiconductor device according to claim 1, wherein the another copper alloy film penetrates into the lower-layer copper or the copper alloy film such that the thickness of the lower-layer copper or copper alloy film varies above said another wiring of said wirings.

4. The method for manufacturing the semiconductor device according to claim 1, wherein the another copper alloy film penetrates into the lower-layer copper or the copper alloy film above said vias connected to said another wiring of said wirings.

5. The method for manufacturing the semiconductor device according to claim 1, wherein the another copper alloy film penetrates into the lower-layer copper or the copper alloy film above said vias connected to the wiring of said wirings.

6. The method for manufacturing the semiconductor device according to claim 1, further comprising:

forming another plurality of wirings below said dual damascene wirings in an inter-layer insulating film disposed on the semiconductor substrate.

7. The method for manufacturing the semiconductor device according to claim 6, wherein each of said another plurality of wirings is disposed below the vias.

8. The method for manufacturing the semiconductor device according to claim 6, wherein the inter-layer insulating film is disposed between adjacent wirings of said another plurality of wirings.

9. The method for manufacturing the semiconductor device according to claim 8, wherein each of the adjacent wirings of said another plurality of wirings is disposed below the vias.

10. A method for manufacturing a semiconductor device, said method comprising:
- forming a first via and a first groove above the first via in an insulating film formed above a semiconductor substrate;
- forming a second via and a second groove above the second via in the insulating film;
- forming a lower-layer copper or copper alloy film to fill the first via, the second via, a part of the first groove to form a first wiring that is five or more times as wide as a diameter of the first via, and the second groove to form a second wiring that is less than five times as wide as a diameter of the second via;
- forming on the lower-layer copper or the copper alloy film another copper alloy film comprising a copper alloy that comprises an added metallic element in a concentration that is higher than that of the added metallic element in the copper or the copper alloy film, the another copper alloy film filling a remaining part of the first groove above the wiring and extending below an upper surface of the lower-layer copper or the copper alloy film above said second via; and
- heating the added metallic element contained in the another copper alloy film to diffuse throughout the lower-layer copper or the copper alloy film.

11. The method for manufacturing the semiconductor device according to claim 10, wherein the another copper alloy film penetrates into the lower-layer copper or the copper alloy film such that a thickness of the lower-layer copper or copper alloy film varies above the second wiring.

12. The method for manufacturing the semiconductor device according to claim 10, further comprising:
- forming another plurality of wirings below the first wiring and the second wiring in an inter-layer insulating film disposed on the semiconductor substrate,
- wherein the inter-layer insulating film is disposed between first and second wirings of said another plurality of wirings, and
- wherein the first and second wirings of said another plurality of wirings are respectively disposed below the first via and the second via.

13. The method for manufacturing the semiconductor device according to claim 10, further comprising:
- forming a third via and a third groove above the third via in the insulating film; and
- filling the third groove to form a third wiring that is less than five times as wide as a diameter of the third via.

14. The method for manufacturing the semiconductor device according to claim 13, wherein a concentration of the added metallic element decreases in order from the first via to the second via and to the third via.

15. The method for manufacturing the semiconductor device according to claim 13, wherein the first via, the second via, and the third via have a same diameter,
- wherein a width of the first wiring is more than a width of the second wiring, and a width of the third wiring is less than the width of the second wiring, and
- wherein a concentration of the added metallic element decreases in order from the first via to the second via and to the third via.

* * * * *